(12) United States Patent
Cho et al.

(10) Patent No.: US 11,929,392 B2
(45) Date of Patent: Mar. 12, 2024

(54) SEMICONDUCTOR DEVICES INCLUDING CAPACITOR AND METHODS OF MANUFACTURING THE SEMICONDUCTOR DEVICES

(71) Applicant: Samsung Electronics Co., Ltd., Suwon-si (KR)

(72) Inventors: Gihee Cho, Yongin-si (KR); Jungoo Kang, Seoul (KR); Sangyeol Kang, Yongin-si (KR); Hyunsuk Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/057,894

(22) Filed: Nov. 22, 2022

(65) Prior Publication Data

US 2023/0084276 A1 Mar. 16, 2023

Related U.S. Application Data

(63) Continuation of application No. 16/592,842, filed on Oct. 4, 2019, now Pat. No. 11,532,696.

(30) Foreign Application Priority Data

Mar. 29, 2019 (KR) .................. 10-2019-0037315

(51) Int. Cl.
*H01L 49/02* (2006.01)
*H10B 12/00* (2023.01)

(52) U.S. Cl.
CPC ............ *H01L 28/60* (2013.01); *H10B 12/315* (2023.02)

(58) Field of Classification Search
CPC ......... H01L 28/60; H01L 28/75; H01L 28/92; H10B 12/03; H10B 12/315; H10B 12/318
See application file for complete search history.

(56) References Cited

U.S. PATENT DOCUMENTS

| | | | |
|---|---|---|---|
| 6,075,691 | A | 6/2000 | Duenas et al. |
| 6,833,577 | B2 | 12/2004 | Matsui et al. |
| 7,112,819 | B2 | 9/2006 | Matsui |
| 9,455,259 | B2 | 9/2016 | Lim et al. |
| 10,174,423 | B2 | 1/2019 | Lansalot-Matras et al. |
| 2008/0272421 | A1 | 11/2008 | Bhat |
| 2010/0127316 | A1 | 5/2010 | Tu et al. |
| 2013/0005110 | A1 | 1/2013 | Yoon et al. |
| 2014/0084419 | A1 | 3/2014 | Shih et al. |
| 2015/0162183 | A1 | 6/2015 | Pore et al. |
| 2016/0307708 | A1 | 10/2016 | Lansalot-Matras et al. |
| 2016/0307904 | A1 | 10/2016 | Lansalot-Matras et al. |
| 2017/0179219 | A1 | 6/2017 | Ishizaka et al. |
| 2018/0108486 | A1 | 4/2018 | Komeda et al. |
| 2020/0105633 | A1 | 4/2020 | Lee et al. |

FOREIGN PATENT DOCUMENTS

JP 4012411 B2 11/2007
KR 10-2016-0032559 A 3/2016

*Primary Examiner* — John A Bodnar
(74) *Attorney, Agent, or Firm* — Myers Bigel, PA

(57) ABSTRACT

Semiconductor devices including a capacitor and methods of forming the same are provided. The semiconductor devices may include a capacitor that include a lower electrode, an upper electrode on the lower electrode, and a dielectric layer extending between the lower electrode and the upper electrode. The lower electrode may include a doped region that contacts the dielectric layer, and the doped region of the lower electrode is configured to increase a capacitance of the capacitor.

20 Claims, 18 Drawing Sheets

SEMICONDUCTOR DEVICES INCLUDING CAPACITOR AND METHODS OF MANUFACTURING THE SEMICONDUCTOR DEVICES

CROSS-REFERENCE TO RELATED APPLICATION

This application is a continuation of U.S. patent application Ser. No. 16/592,842, filed Oct. 4, 2019, which claims priority under 35 U.S.C. § 119 to Korean Patent Application No. 10-2019-0037315, filed on Mar. 29, 2019, in the Korean Intellectual Property Office, the disclosure of which is incorporated herein in its entirety by reference.

BACKGROUND

The inventive concept relates to a semiconductor device, and more particularly, to a semiconductor device including a capacitor.

The capacitor may include two electrodes and a dielectric layer between the two electrodes. Capacitance may be proportionate to an area of the capacitor and a dielectric constant of the dielectric layer. As a degree of integration of semiconductor devices increases, the area of the capacitor in the semiconductor device may be reduced, and the capacitance of the capacitor may also be reduced. Accordingly, forming a dielectric layer having a higher dielectric constant may be beneficial to maintain capacitance of a capacitor.

SUMMARY

The inventive concept provides semiconductor devices including a capacitor having high capacitance by providing a dielectric layer having a high dielectric constant.

According to some embodiments of the inventive concept, semiconductor devices may include a capacitor that include a lower electrode, an upper electrode on the lower electrode, and a dielectric layer extending between the lower electrode and the upper electrode. The lower electrode may include a doped region that contacts the dielectric layer, and the doped region of the lower electrode is configured to increase a capacitance of the capacitor.

According to some embodiments of the inventive concept, semiconductor devices may include a capacitor that include a lower electrode, an upper electrode on the lower electrode, and a dielectric layer extending between the lower electrode and the upper electrode and extending on an upper surface and a side wall of the lower electrode. The lower electrode may include an undoped region and a doped region, and the doped region of the lower electrode may extend between the undoped region of the lower electrode and the upper surface of the lower electrode and may extend between the undoped region of the lower electrode and the side wall of the lower electrode.

According to some embodiments of the inventive concept, semiconductor devices may include a capacitor that include a lower electrode, an upper electrode on the lower electrode, and a dielectric layer extending between the lower electrode and the upper electrode and extending on an upper surface and a side wall of the lower electrode. The lower electrode may include an undoped region and a doped region, and the doped region of the lower electrode may include a first portion extending between the undoped region of the lower electrode and the side wall of the lower electrode and a second portion extending between the undoped region of the lower electrode and a lower surface of the lower electrode or extending between the undoped region of the lower electrode and the upper surface of the lower electrode.

According to some embodiments of the inventive concept, methods of manufacturing a semiconductor device may include forming a capacitor by performing operations that include forming a lower electrode, forming a doped region in a surface portion of the lower electrode, forming a dielectric layer on the doped region, and forming an upper electrode on the dielectric layer.

According to some embodiments of the inventive concept, methods of manufacturing a semiconductor device may include forming a capacitor by performing operations that include forming a mold layer, forming a hole extending through the mold layer, forming a first lower electrode layer in the hole, forming a source layer on the first lower electrode layer, moving dopants from the source layer into the first lower electrode layer, removing the source layer, forming a second lower electrode layer on the first lower electrode layer, removing the mold layer, forming a dielectric layer on the first lower electrode layer, and forming an upper electrode on the dielectric layer.

According to some embodiments of the inventive concept, methods of manufacturing a semiconductor device may include forming a capacitor by performing operations that include forming a mold layer, forming a hole extending through the mold layer, forming a source layer in the hole, forming a lower electrode on the source layer, forming a doped region in the lower electrode by moving dopants from the source layer into the lower electrode, removing the mold layer, removing at least a portion of the source layer, forming a dielectric layer on the lower electrode, and forming an upper electrode on the dielectric layer.

According to some embodiments of the inventive concept, semiconductor devices may include a first capacitor that include a lower electrode comprising a doped region that includes dopants including a chemical element, an upper electrode on the lower electrode, and a dielectric layer between the lower electrode and the upper electrode. The doped region of the lower electrode may contact the dielectric layer, and a first capacitance of the first capacitor may be greater than a second capacitance of a second capacitor that is identical to the first capacitor except that the second capacitor does not include the chemical element therein.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
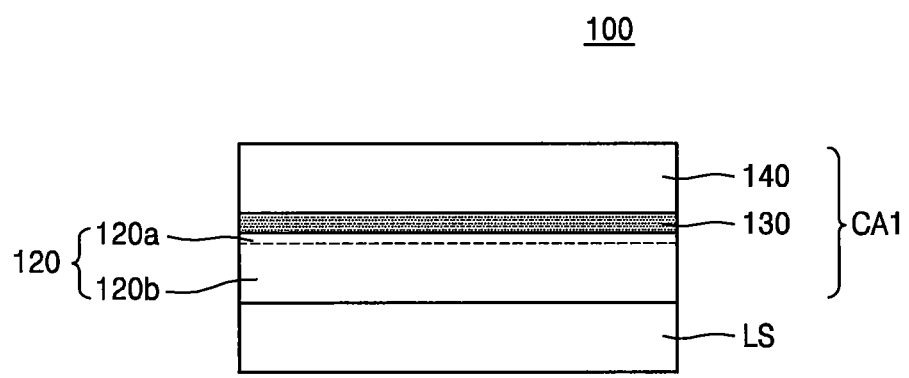
FIG. 1 is a cross-sectional view illustrating a semiconductor device including a capacitor, according to some embodiments of the inventive concept.

FIG. 1 is a cross-sectional view illustrating a semiconductor device 100 including a capacitor, according to some embodiments of the inventive concept.

Referring to FIG. 1, the semiconductor device 100 including the capacitor, according to some embodiments of the inventive concept, may include a lower structure LS and a capacitor CA1 on the lower structure LS.

The lower structure LS may include, for example, a substrate. The lower structure LS may include, for example, a substrate on which a transistor is formed.

The capacitor CA1 may include a lower electrode 120, a dielectric layer 130 on the lower electrode 120, and an upper electrode 140 on the dielectric layer 130. That is, the capacitor CA1 may include the lower electrode 120, the upper electrode 140 that faces the lower electrode 120, and the dielectric layer 130 between the lower electrode 120 and the upper electrode 140.

The lower electrode 120 may include silicon, a metal, a metal compound, or a combination thereof. However, the inventive concept is not limited thereto. In FIG. 1, the lower electrode 120 is illustrated as being flat. However, the shape of the lower electrode 120 is not limited thereto. In some embodiments, the lower electrode 120 may include a metal nitride such as a titanium nitride (TiN), a tungsten nitride (WN), a tantalum nitride (TaN), or a molybdenum nitride (MoN). However, the inventive concept is not limited thereto. The lower electrode 120 may include a doped region 120a that contacts the dielectric layer 130. The doped region 120a may be an upper portion of the lower electrode 120. The doped region 120a of the lower electrode 120 may further include dopants. The dopants may be, for example, niobium (Nb), vanadium (V), chrome (Cr), tantalum (Ta), molybdenum (Mo), tungsten (W), cobalt (Co), rhodium (Rh), iridium (Ir), or a combination of the above metals. However, the inventive concept is not limited thereto. In some embodiments, a doping concentration in the doped region 120a of the lower electrode 120 may decrease as a distance from the dielectric layer 130 increases. That is, the doping concentration in the doped region 120a of the lower electrode 120 may be greatest (e.g., highest) on or adjacent an upper surface of the lower electrode 120 and may decrease as a distance from the upper surface of the lower electrode 120 increases. In some embodiments, a thickness of the doped region 120a may be greater than 0 nm and no more than about 10 nm, for example, greater than 0 nm and no more than about 5 nm or greater than 0 nm and no more than about 2 nm. However, the inventive concept is not limited thereto. It will be understood that the term "a doping concentration" can be interchangeable with "a dopant concentration." It will be also understood that "a distance from an element A" (or similar language) used herein may refer to a shortest distance from the element A.

In some embodiments, the lower electrode 120 may further include a non-doped region 120b. The non-doped region 120b of the lower electrode 120 may not substantially include the dopant of the doped region 120a. For example, the non-doped region 120b of the lower electrode 120 may have a dopant concentration of no more than 1% of the greatest dopant concentration of the doped region 120a of the lower electrode 120. For example, when the doping concentration in the lower electrode 120 decreases as a distance from the dielectric layer 130 increases, the non-doped region 120b of the lower electrode 120 may have a dopant concentration of no more than 1% of the doping concentration on or adjacent the upper surface of the doped region 120a of the lower electrode 120.

It will be understood that "a non-doped region" may refer to a region into which no dopant has been intentionally added and may also be referred to as "an undoped region." It will be also understood that a portion of the non-doped region may be substantially devoid of a chemical element that is the same as dopants of the doped region and may have a dopant concentration equal to or less than 1% of the highest dopant concentration of the doped region. Further, it will be understood that a portion of the non-doped region may include a chemical element that is originated from (e.g., diffused from) the doped region.

The dielectric layer 130 may include, for example, a metal oxide. The dielectric layer 130 may include a hafnium oxide ($HfO_2$), a zirconium oxide ($ZrO_2$), an aluminum oxide ($Al_2O_3$), a lanthanum oxide ($La_2O_3$), a tantalum oxide ($Ta_2O_3$), a titanium oxide ($TiO_2$), or a combination thereof. However, the inventive concept is not limited thereto.

The upper electrode 140 may include silicon, a metal, a metal compound, or a combination thereof. However, the inventive concept is not limited thereto. In FIG. 1, the upper electrode 140 is illustrated as being flat. However, the shape of the upper electrode 140 is not limited thereto. In some embodiments, the upper electrode 140 may include a metal nitride such as TiN, WN, TaN, or MoN. However, the inventive concept is not limited thereto.

The capacitance of the capacitor CA1 may be greater than the capacitance of a capacitor in which the lower electrode 120 does not include the doped region 120a. For example, the dielectric layer 130 may have a greater dielectric constant than a dielectric layer under which the lower electrode 120 that does not include the doped region 120a is formed. This may be because the doped region 120a of the lower electrode 120 affects a crystal phase of the dielectric layer 130 formed on the lower electrode 120. For example, this is because the doped region 120a of the lower electrode 120 affects a crystal phase ratio in the dielectric layer 130 formed on the lower electrode 120.

In some embodiments, the doped region 120a of the lower electrode 120 may increase the capacitance of the capacitor CA1. The doped region 120a of the lower electrode 120 may increase the dielectric constant of the dielectric layer 130 and thus may increase the capacitance of the capacitor CA1. The doped region 120a of the lower electrode 120 may change a crystal phase ratio of the dielectric layer 130 and thus may increase the capacitance of the capacitor CA1.

It will be understood that the capacitance of the capacitor CA1 may be greater than a capacitance of a second capacitor that is identical to the capacitor CA1 except that the second capacitor does not include dopants (e.g., the chemical element) in a lower electrode thereof. The second capacitor may include the lower electrode, a dielectric layer, and an upper electrode, each of which includes the same material as the corresponding elements of the capacitor CA1 and has a thickness identical to that of the corresponding elements of the capacitor CA1. For example, the upper electrode of the capacitor CA1 and the upper electrode of the second capacitor may include the same material and may have the identical thickness. In some embodiments, the dielectric layer of the capacitor CA1 may have a dielectric constant greater than a dielectric constant of the dielectric layer of the second capacitor. In some embodiments, the dielectric layer of the capacitor CA1 may have a crystal phase ratio different from a crystal phase ratio of the dielectric layer of the second capacitor. For example, a first sample includes a lower electrode including a Nb-doped TiN and a dielectric layer including a $HfO_2$ formed on the lower electrode and a second sample (reference) includes a lower electrode including a TiN that is not doped with Nb and a dielectric layer including a $HfO_2$ formed on the lower electrode. That is, the lower electrode of the first sample includes a doped region and the lower electrode of the second sample (reference) does not include a doped region. In this case, the dielectric layer of the first sample may be formed to have a crystal phase ratio different from that of the dielectric layer of the second sample. For example, a ratio of a tetragonal phase to a monoclinic phase of the dielectric layer of the first sample may be greater than that of the dielectric layer of the second sample. Due to this difference in crystal phase ratio, the dielectric layer of the first sample may have a greater dielectric constant than that of the dielectric layer of the second sample (reference).

As described above, the capacitor CA1 according to some embodiments of the inventive concept includes the doped region 120a of the lower electrode 120 and accordingly, the dielectric layer 130 having a greater dielectric constant may be obtained and greater capacitance may be obtained.

Figure 2A:
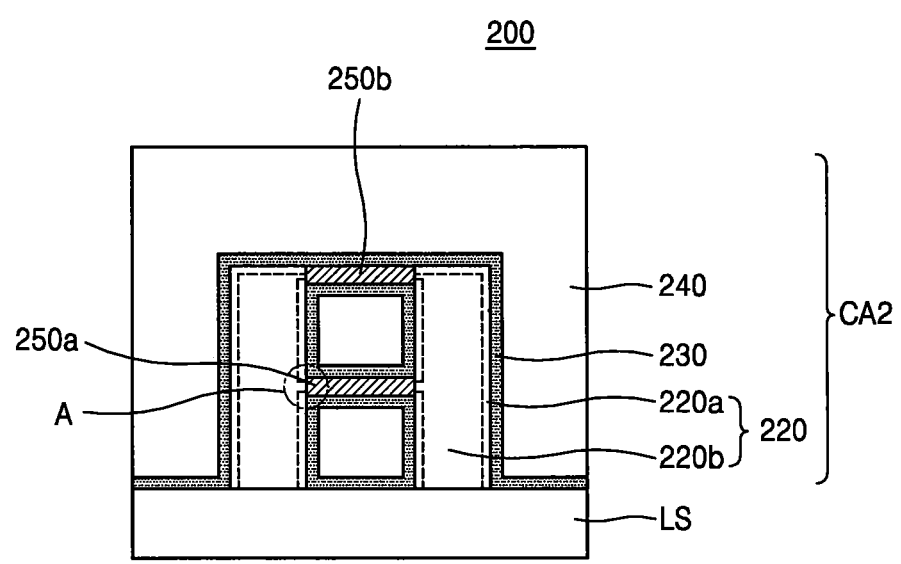
FIG. 2A is a cross-sectional view illustrating a semiconductor device including a capacitor, according to some embodiments of the inventive concept.
Figure 2B:
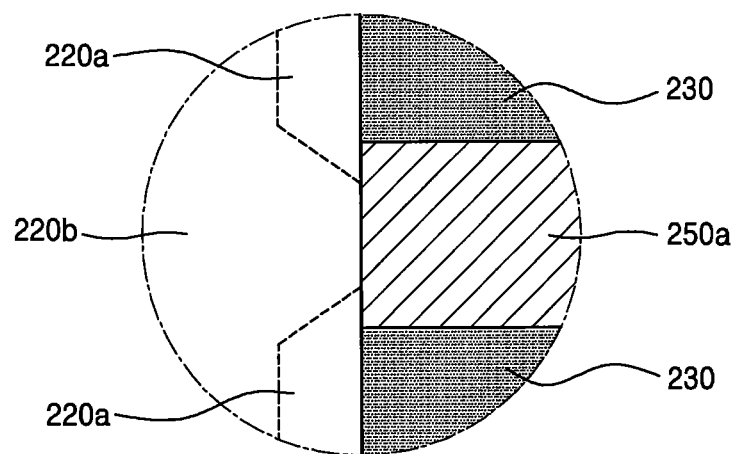
FIG. 2B is an enlarged view of a region A of FIG. 2A.
Figure 2C:
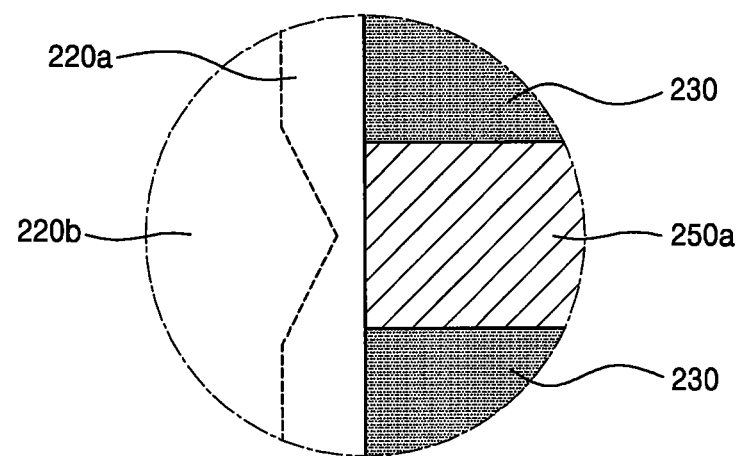
FIG. 2C is an enlarged view of a region A of FIG. 2A.
Figure 2D:
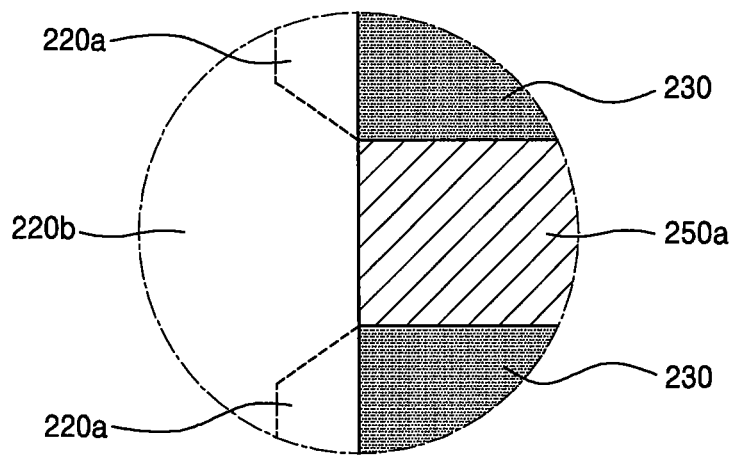
FIG. 2D is an enlarged view of a region A of FIG. 2A.

FIG. 2A is a cross-sectional view illustrating a semiconductor device 200 including a capacitor, according to some embodiments of the inventive concept. FIG. 2B, FIG. 2C, and FIG. 2D are each an enlarged view of a region A of FIG. 2A according to some embodiments of the inventive concept.

Referring to FIG. 2A, the semiconductor device 200 including the capacitor, according to some embodiments of the inventive concept, may include a lower structure LS and a capacitor CA2 on the lower structure LS.

The capacitor CA2 may include a lower electrode 220, a dielectric layer 230 that extends on (e.g., covers) an upper surface and side wall of the lower electrode 220, and an upper electrode 240 that extends on (e.g., covers) the dielectric layer 230. It will be understood that "an element A covers a surface of an element B" (or similar language) means that the element A is on the surface of the element B but does not necessarily mean that the element A covers the surface of the element B entirely.

In FIG. 2A, the lower electrode 220 is illustrated as being a cylindrical shape. However, the shape of the lower electrode 220 is not limited thereto. The lower electrode 220 may include a doped region 220a and a non-doped region 220b. The doped region 220a of the lower electrode 220 may be between the non-doped region 220b of the lower electrode 220 and an upper surface of the lower electrode 220 and between the non-doped region 220b of the lower electrode 220 and the side wall of the lower electrode 220. In some embodiments, a doping concentration in the doped region 220a of the lower electrode 220 may decrease as a distance from the upper surface and side wall of the lower electrode 220 increases. That is, the doping concentration in the doped region 220a of the lower electrode 220 may be greatest on the upper surface and side wall of the lower electrode 220. In some embodiments, as illustrated in FIG. 2A, the upper surface and side wall of the lower electrode 220 contact the dielectric layer 230.

The capacitance of the capacitor CA2 may be greater than the capacitance of a capacitor in which the lower electrode 220 does not include the doped region 220a. For example, the dielectric layer 230 may have a greater dielectric constant than a dielectric layer under which the lower electrode 220 that does not include the doped region 220a is formed. This is because the doped region 220a of the lower electrode 220 affects a crystal phase of the dielectric layer 230 formed on the lower electrode 220. For example, this is because the doped region 220a of the lower electrode 220 affects a crystal phase ratio in the dielectric layer 230 formed on the lower electrode 220.

In some embodiments, the capacitor CA2 may further include at least one of supporting layers 250a and 250b that contact the side wall of the lower electrode 220. In FIG. 2A, the capacitor CA2 is illustrated as including the two supporting layers 250a and 250b. However, the capacitor CA2 may include only one supporting layer or two or more supporting layers. The supporting layers 250a and 250b may support (e.g., structurally support) the lower electrode 220. The supporting layers 250a and 250b may include a silicon oxide, a silicon nitride, a silicon oxynitride, or a combination thereof. However, the inventive concept is not limited thereto.

Referring to FIG. 2B, in some embodiments, both the doped region 220a and the non-doped region 220b may contact the supporting layer 250a. Referring to FIG. 2C, in some embodiments, the doped region 220a contacts the supporting layer 250a and the non-doped region 220b may not contact the supporting layer 250a. Referring to FIG. 2D, in some embodiments, the doped region 220a does not contact the supporting layer 250a and the non-doped region 220b may contact the supporting layer 250a.

Figure 3:
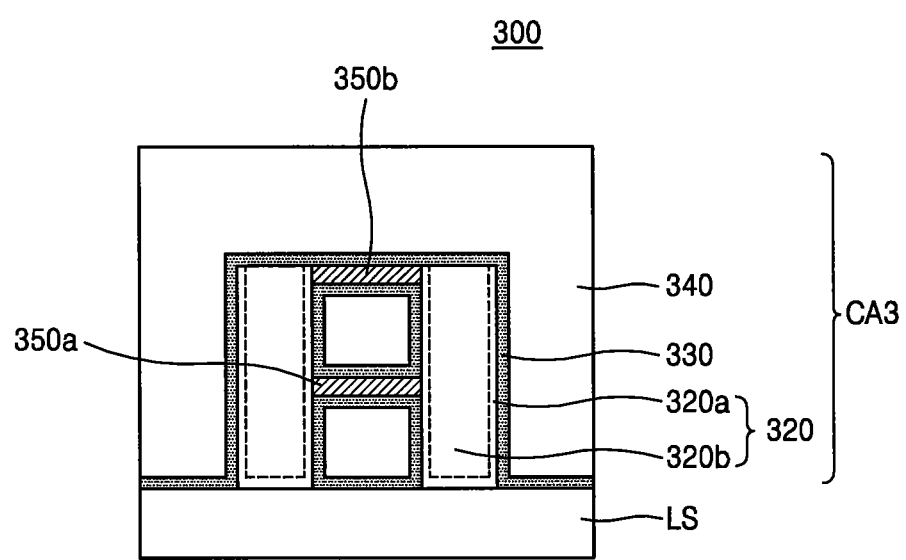
FIG. 3 is a cross-sectional view illustrating a semiconductor device including a capacitor, according to some embodiments of the inventive concept.

FIG. 3 is a cross-sectional view illustrating a semiconductor device 300 including a capacitor, according to some embodiments of the inventive concept.

Referring to FIG. 3, the semiconductor device 300 including the capacitor, according to some embodiments of the inventive concept, may include a lower structure LS and a capacitor CA3 on the lower structure LS.

The capacitor CA3 may include a lower electrode 320, a dielectric layer 330 that covers an upper surface and side wall of the lower electrode 320, and an upper electrode 340 that covers the dielectric layer 330.

The lower electrode 320 may include a doped region 320a and a non-doped region 320b. The doped region 320a of the lower electrode 320 may be between the non-doped region 320b of the lower electrode 320 and a side wall of the lower electrode 320 and between the non-doped region 320b of the lower electrode 320 and a lower surface of the lower electrode 320. In some embodiments, a doping concentration in the doped region 320a of the lower electrode 320 may increase as a distance from the side wall and lower surface of the lower electrode 320 increases. That is, the doping concentration in the doped region 320a may be greatest adjacent an interface between the doped region 320a and the non-doped region 320b.

The capacitance of the capacitor CA3 may be greater than the capacitance of a capacitor in which the lower electrode 320 does not include the doped region 320a. For example, the dielectric layer 330 may have a greater dielectric constant than a dielectric layer under which the lower electrode 320 that does not include the doped region 320a is formed. This is because the doped region 320a of the lower electrode 320 affects a crystal phase of the dielectric layer 330 formed on the lower electrode 320. For example, this is because the doped region 320a of the lower electrode 320 affects a crystal phase ratio in the dielectric layer 330 formed on the lower electrode 320.

In some embodiments, the capacitor CA3 may further include at least one of supporting layers 350a and 350b that contact the side wall of the lower electrode 320. The supporting layers 350a and 350b contact the doped region 320a of the lower electrode 320 and may not contact the non-doped region 320b of the lower electrode 320.

Figure 4:
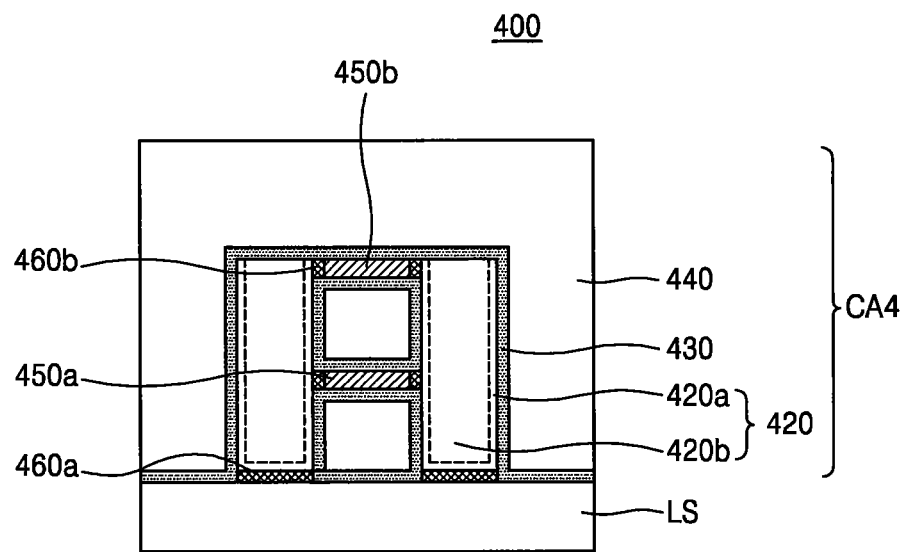
FIG. 4 is a cross-sectional view illustrating a semiconductor device including a capacitor, according to some embodiments of the inventive concept.

FIG. 4 is a cross-sectional view illustrating a semiconductor device 400 including a capacitor, according to some embodiments of the inventive concept.

Referring to FIG. 4, the semiconductor device 400 including the capacitor, according to some embodiments of the inventive concept, may include a lower structure LS and a capacitor CA4 on the lower structure LS.

The capacitor CA4 may include a lower electrode 420, a dielectric layer 430 that covers an upper surface and side wall of the lower electrode 420, and an upper electrode 440 that covers the dielectric layer 430.

The lower electrode 420 may include a doped region 420a and a non-doped region 420b. The doped region 420a of the lower electrode 420 may be between the non-doped region 420b of the lower electrode 420 and a side wall of the lower electrode 420 and between the non-doped region 420b of the lower electrode 420 and a lower surface of the lower electrode 420. In some embodiments, a doping concentration in the doped region 420a of the lower electrode 420 may decrease as a distance from the side wall and lower surface of the lower electrode 420 increases. That is, the doping concentration in the doped region 420a may be greatest adjacent the side wall and lower surface of the lower electrode 420.

The capacitance of the capacitor CA4 may be greater than the capacitance of a capacitor in which the lower electrode 420 does not include the doped region 420a. For example, the dielectric layer 430 may have a greater dielectric constant than a dielectric layer under which the lower electrode 420 that does not include the doped region 420a is formed. This is because the doped region 420a of the lower electrode 420 affects a crystal phase of the dielectric layer 430 formed on the lower electrode 420. For example, this is because the doped region 420a of the lower electrode 420 affects a crystal phase ratio in the dielectric layer 430 formed on the lower electrode 420.

In some embodiments, the capacitor CA4 may further include a first residual layer 460a that contacts the lower surface of the lower electrode 420. The first residual layer 460a may include dopants of the doped region 420a of the lower electrode 420. The first residual layer 460a may include, for example, an Nb nitride (NbN), a V nitride (VN), a Cr nitride (CrN), a Ta nitride (TaN), a Mo nitride (MoN), a W nitride (WN), a Co nitride (CoN), an Rh nitride (RhN), an Ir nitride (IrN), or a combination thereof.

In some embodiments, the capacitor CA4 may further include at least one of supporting layers 450a and 450b supporting the lower electrode 420. In addition, the capacitor CA4 may further include a second residual layer 460b between the side wall of the lower electrode 420 and the supporting layers 450a and 450b. The second residual layer 460b may include dopants of the doped region 420a of the lower electrode 420. The second residual layer 460b may include, for example, NbN, VN, CrN, TaN, MoN, WN, CoN, RhN, IrN, or the combination thereof.

FIGS. 5A to 5E are cross-sectional views illustrating a method of manufacturing a semiconductor device including a capacitor, according to some embodiments of the inventive concept.

Figure 5A:
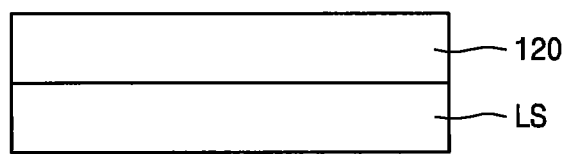
FIGS. 5A to 5E are cross-sectional views illustrating a method of manufacturing a semiconductor device including a capacitor, according to some embodiments of the inventive concept.

Referring to FIG. 5A, the lower electrode 120 may be formed on the lower structure LS. For example, in order to form the lower electrode 120, sputtering, evaporation, atomic layer deposition (ALD), chemical vapor deposition (CVD), or a combination thereof may be used.

Figure 5B:
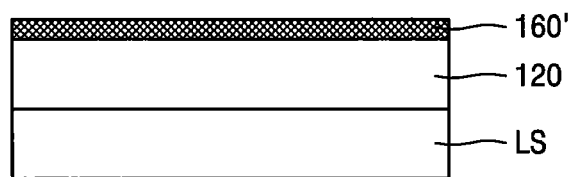

Referring to FIG. 5B, a source layer 160' may be formed on the lower electrode 120. In order to form the source layer 160', sputtering, evaporation, ALD, CVD, or a combination thereof may be used. The source layer 160' may include dopants. For example, the source layer 160' may include, for example, NbN, VN, CrN, TaN, MoN, WN, CoN, RhN, IrN, or the combination thereof. However, the inventive concept is not limited thereto.

Figure 5C:
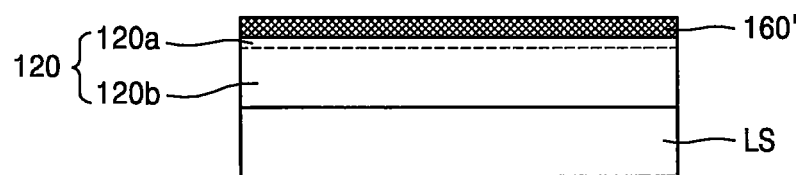

Referring to FIG. 5C, the doped region 120a may be formed in a surface portion of the lower electrode 120 by moving the dopants in the source layer 160' into the lower electrode 120. For example, the dopants in the source layer 160' may be diffused into the lower electrode 120 by increasing temperatures of the lower electrode 120 and the source layer 160'. Thermal treatment may be performed on the lower electrode 120 and the source layer 160' in, for example, an ammonia ($NH_3$) atmosphere, a nitrogen ($N_2$) atmosphere, an argon (Ar) atmosphere, or a combination thereof. The thermal treatment may be performed on the lower electrode 120 and the source layer 160' at a temperature of about 200° C. to about 800° C., for example, about 400° C. to about 600° C.

Figure 5D:
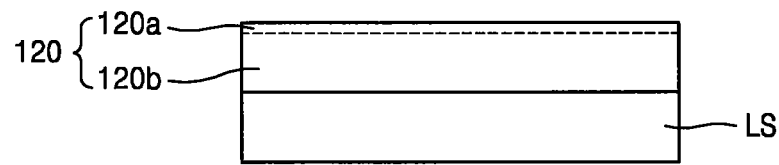

Referring to FIGS. 5C and 5D, after forming the doped region 120a of the lower electrode 120, the source layer 160' may be removed. In order to remove the source layer 160', for example, dry etch or wet etch may be used.

Figure 5E:
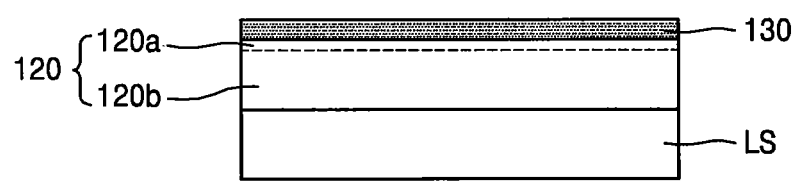

Referring to FIG. 5E, the dielectric layer 130 is formed on the doped region 120a of the lower electrode 120. The dielectric layer 130 may be formed by, for example, ALD. The doped region 120a of the lower electrode 120 may affect the crystal phase of the dielectric layer 130. Therefore, the dielectric layer 130 formed on the doped region 120a of the lower electrode 120 may have a higher dielectric constant than that in the case in which the lower electrode 120 does not include the doped region 120a.

Referring back to FIG. 1, the upper electrode 140 may be formed on the dielectric layer 130. In order to form the upper electrode 140, sputtering, evaporation, ALD, CVD, or a combination thereof may be used.

The semiconductor device 100 illustrated in FIG. 1 may be completely formed by the above processes. The capacitor CA1 included in the semiconductor device 100 may have the dielectric layer 130 having a greater dielectric constant and accordingly, may have greater capacitance by including the doped region 120a of the lower electrode 120.

FIGS. 6A to 6J are cross-sectional views illustrating a method of manufacturing a semiconductor device including a capacitor, according to some embodiments of the inventive concept.

Figure 6A:
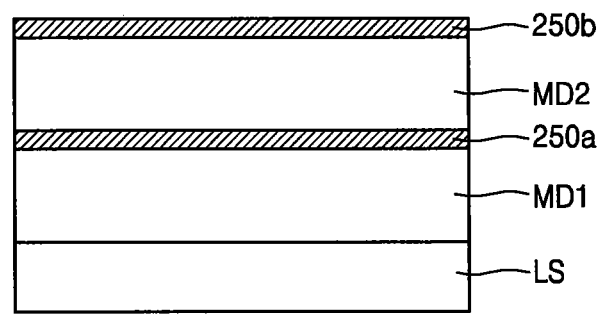
FIGS. 6A to 6J are cross-sectional views illustrating a method of manufacturing a semiconductor device including a capacitor, according to some embodiments of the inventive concept.

Referring to FIG. 6A, a first mold layer MD1, a first supporting layer 250a, a second mold layer MD2, and a second supporting layer 250b are sequentially formed on a lower structure LS. The first mold layer MD1 and the second mold layer MD2 may include, for example, silicon oxide, silicon nitride, silicon oxynitride, or a combination thereof. However, the inventive concept is not limited thereto. The first supporting layer 250a and the second supporting layer 250b may include a material having an etch selectivity with respect to the first mold layer MD1 and the second mold layer MD2. For example, the first mold layer MD1 and the second mold layer MD2 may include silicon oxide, and the first supporting layer 250a and the second supporting layer 250b may include silicon nitride. The first mold layer MD1 and the second mold layer MD2 may be formed by spin coating, sputtering, evaporation, CVD, or a combination thereof. The first supporting layer 250a and the second supporting layer 250b may be formed by sputtering, evaporation, CVD, ALD, or a combination thereof.

Figure 6B:
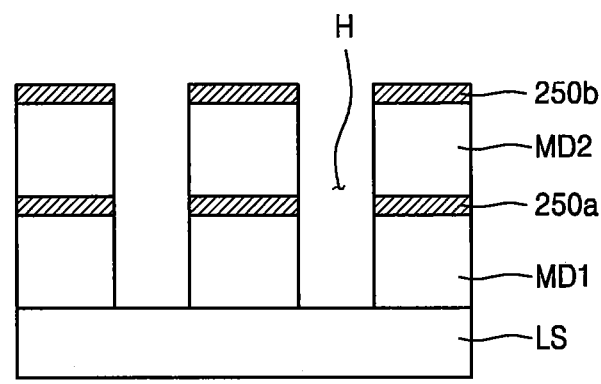

Referring to FIG. 6B, holes H may be formed through the first mold layer MD1, the first supporting layer 250a, the second mold layer MD2, and the second supporting layer 250b and expose the lower structure LS. For example, the second supporting layer 250b, the second mold layer MD2, the first supporting layer 250a, and the first mold layer MD1 may be sequentially etched by forming a mask pattern that defines the holes H on the second supporting layer 250b and using the mask pattern as an etch mask.

Figure 6C:
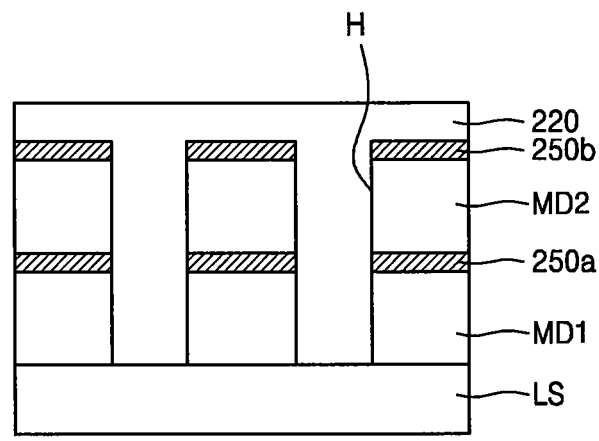

Referring to FIG. 6C, a lower electrode 220 may be formed in the holes H. The lower electrode 220 may be formed to fill the holes H and to cover the second supporting layer 250b. In some embodiments, the lower electrode 220 may conformally cover side surfaces and bottoms of the holes H without completely filling the holes H.

Figure 6D:
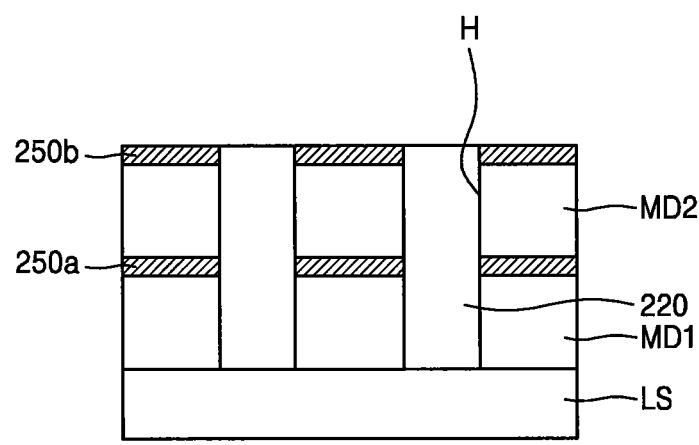

Referring to FIG. 6D, the lower electrode 220 on the second supporting layer 250b is removed by using etch back or polishing. Therefore, only the lower electrode 220 in the holes H may remain.

Figure 6E:
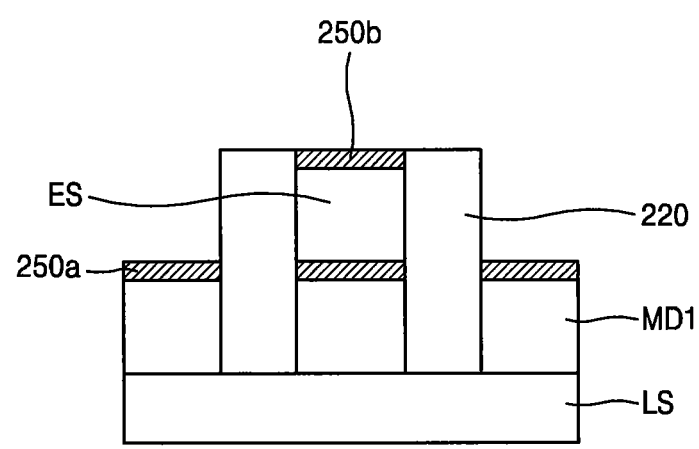

Referring to FIGS. 6D and 6E, the second supporting layer 250b may be patterned. The second supporting layer 250b may be etched by forming the mask pattern on the second supporting layer 250b and using the mask pattern as the etch mask. The patterned second supporting layer 250b may expose a part of the second mold layer MD2. Next, the second mold layer MD2 may be removed. An empty space ES may be formed between the first supporting layer 250a and the second supporting layer 250b by removing the second mold layer MD2. A side wall on the upper portion of the lower electrode 220 and an upper surface of the first supporting layer 250a may be exposed in the empty space ES.

Figure 6F:
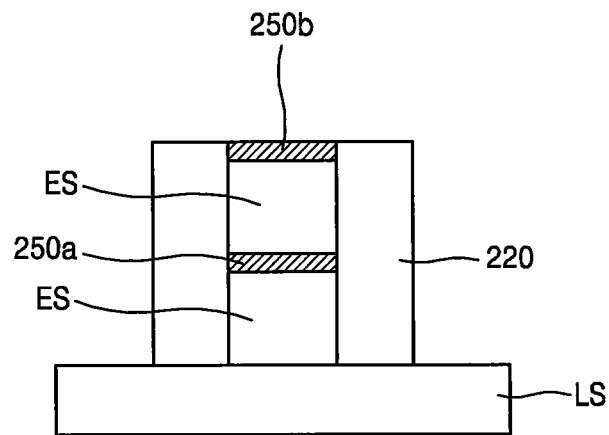

Referring to FIGS. 6E and 6F, the first supporting layer 250a may be patterned by etching the first supporting layer 250a by using the mask pattern or the second supporting layer 250b as the etch mask. The patterned first supporting layer 250a may expose a part of the first mold layer MD1. Next, the first mold layer MD1 may be removed. An empty space ES may be formed between the lower structure LS and the first supporting layer 250a by removing the first mold layer MD1. A side wall of the lower electrode 220 and an upper surface of the lower structure LS may be exposed in the empty space ES.

Figure 6G:
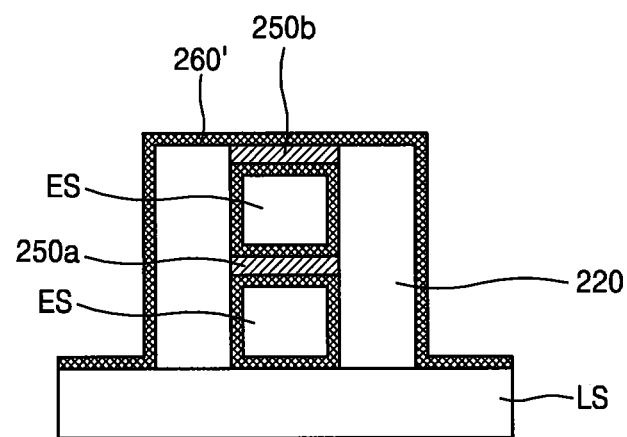

Referring to FIG. 6G, a source layer 260' may be formed on the upper surface and side wall of the lower electrode 220. The source layer 260' may also cover the upper surface of the lower structure LS, upper and lower surfaces of the first supporting layer 250a, and upper and lower surfaces of the second supporting layer 250b.

Figure 6H:
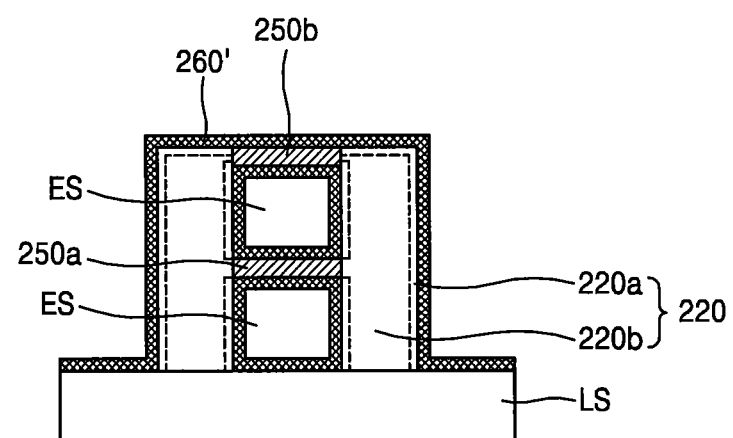

Referring to FIG. 6H, the doped region 220a may be formed on the surface of the lower electrode 220 by moving dopants in the source layer 260' into the lower electrode 220. For example, the dopants in the source layer 260' may be diffused into the lower electrode 220 by increasing temperatures of the lower electrode 220 and the source layer 260'.

Figure 6I:
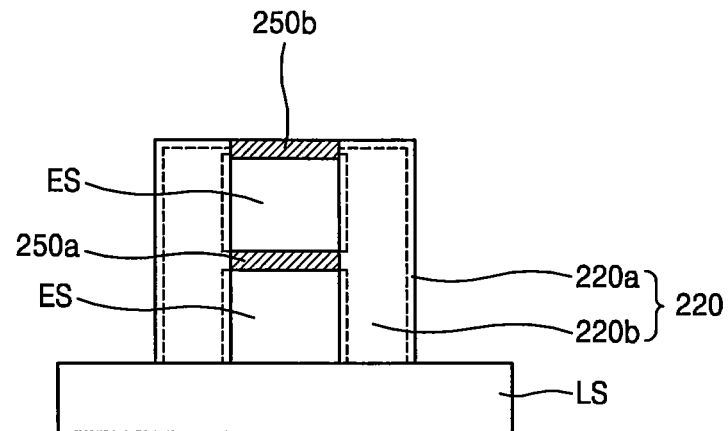

Referring to FIGS. 6H and 6I, after forming the doped region 220a of the lower electrode 220, the source layer 260' may be removed.

Figure 6J:
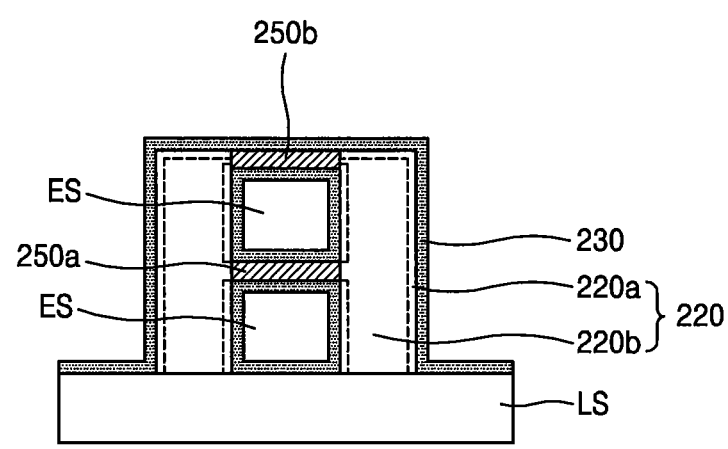

Referring to FIG. 6J, the dielectric layer 230 may be formed on the upper surface and side wall of the lower electrode 220. The dielectric layer 230 may also cover the upper surface of the lower structure LS, the upper and lower surfaces of the first supporting layer 250a, and the upper and lower surfaces of the second supporting layer 250b. The doped region 220a of the lower electrode 220 may affect the crystal phase of the dielectric layer 230. Therefore, the dielectric layer 230 formed on the doped region 220a of the lower electrode 220 may have a higher dielectric constant than that in the case in which the lower electrode 220 does not include the doped region 220a.

Referring back to FIG. 2, the upper electrode 240 may be formed on the dielectric layer 230. The semiconductor 200 illustrated in FIG. 2 may be completely formed by the above processes. The capacitor CA2 included in the semiconductor device 200 may include the dielectric layer 230 having a greater dielectric constant and accordingly, may have greater capacitance by including the doped region 220a of the lower electrode 220.

FIGS. 7A to 7J are cross-sectional views illustrating a method of manufacturing a semiconductor device including a capacitor, according to some embodiments of the inventive concept.

Figure 7A:
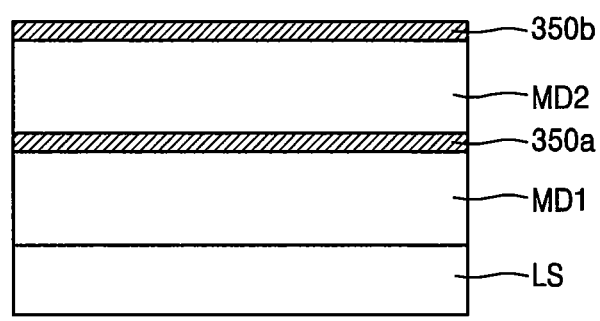
FIGS. 7A to 7J are cross-sectional views illustrating a method of manufacturing a semiconductor device including a capacitor, according to some embodiments of the inventive concept.

Referring to FIG. 7A, a first mold layer MD1, a first supporting layer 350a, a second mold layer MD2, and a second supporting layer 350b are sequentially formed on a lower structure LS.

Figure 7B:
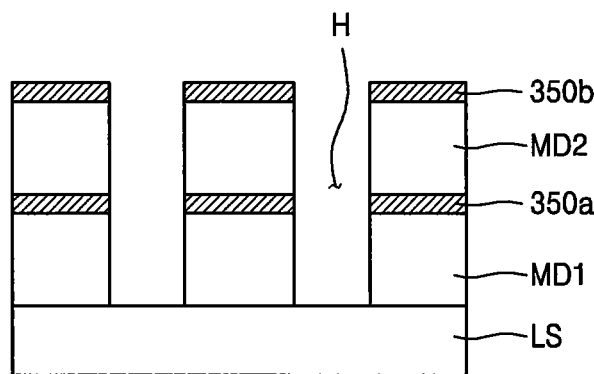

Referring to FIG. 7B, holes H may be formed through the first mold layer MD1, the first supporting layer 350a, the second mold layer MD2, and the second supporting layer 350b and expose the lower structure LS.

Figure 7C:
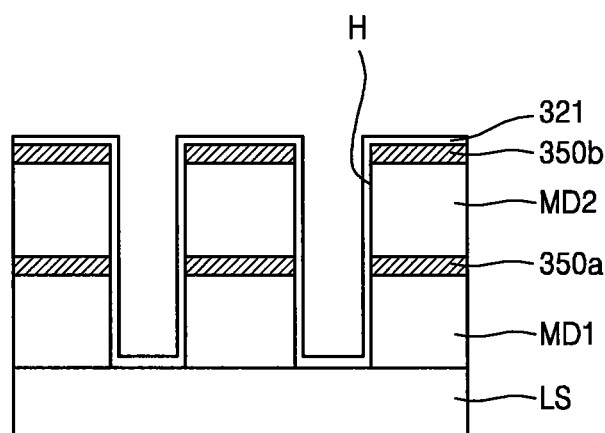

Referring to FIG. 7C, a first lower electrode layer 321 may be formed in the holes H. The first lower electrode layer 321 may conformally cover side surfaces and bottoms of the holes H without completely filling the holes H. The first lower electrode layer 321 may also cover the second supporting layer 350b.

Figure 7D:
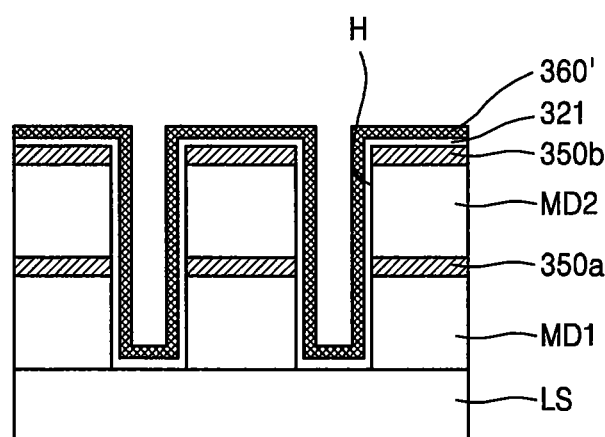

Referring to FIG. 7D, a source layer 360' may be formed on the first lower electrode layer 321. Then, dopants in the source layer 360' may be moved into the first lower electrode layer 321. For example, the dopants in the source layer 360' may be diffused into the first lower electrode layer 321 by increasing temperatures of the source layer 360' and the first lower electrode layer 321.

Figure 7E:
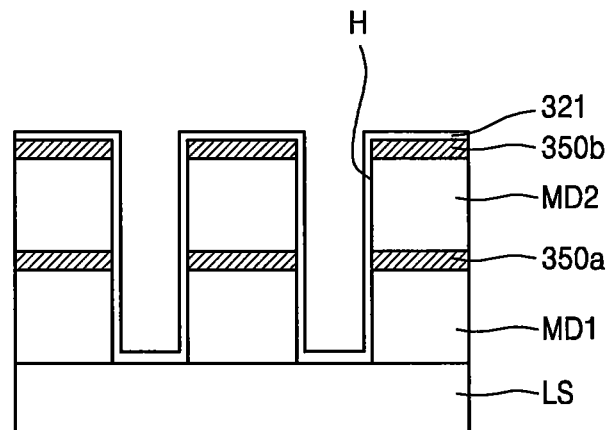

Referring to FIGS. 7D and 7E, after moving the dopants in the source layer 360' into the first lower electrode layer 321, the source layer 360' may be removed.

Figure 7F:
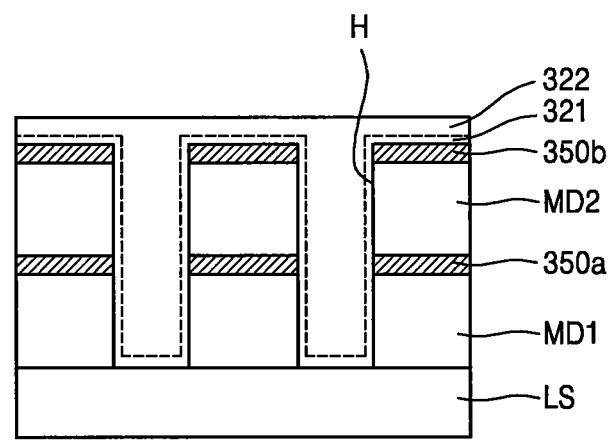

Referring to FIG. 7F, a second lower electrode layer 322 may be formed on the first lower electrode layer 321. The second lower electrode layer 322 may include the same material as that of the first lower electrode layer 321.

Figure 7G:
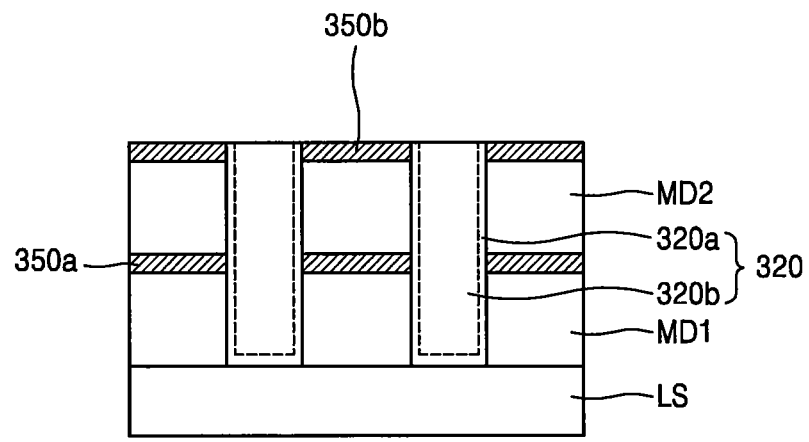

Referring to FIGS. 7F and 7G, portions of the first lower electrode layer 321 and the second lower electrode layer 322 that cover the second supporting layer 350b may be removed. For example, etch back or polishing may be used. Therefore, the lower electrode 320 may be completely formed. A remaining portion of the first lower electrode layer 321 may be referred to as a doped region 320a of the lower electrode 320 and a remaining portion of the second lower electrode layer 322 may be referred to as a non-doped region 320b of the lower electrode 320.

Figure 7H:
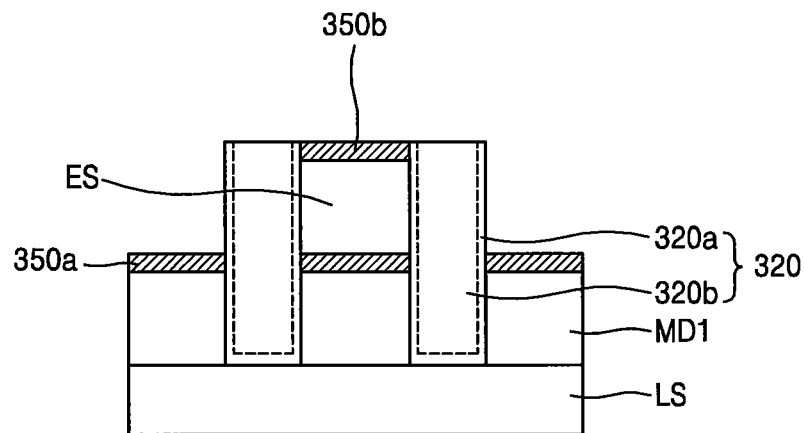

Referring to FIGS. 7G and 7H, the second supporting layer 350b may be patterned. The second supporting layer 350b may be etched by forming a mask pattern on the second supporting layer 350b and using the mask pattern as an etch mask. The patterned second supporting layer 350b may expose a part of the second mold layer MD2. Next, the second mold layer MD2 may be removed. An empty space ES may be formed between the first supporting layer 350a and the second supporting layer 350b by removing the second mold layer MD2. A side wall on the upper portion of the lower electrode 320 and an upper surface of the first supporting layer 350a may be exposed in the empty space ES.

Figure 7I:
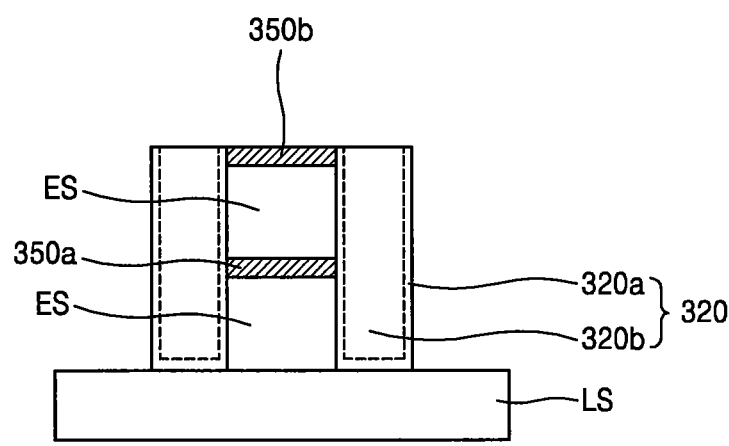

Referring to FIGS. 7H and 7I, the first supporting layer 350a may be patterned by etching the first supporting layer 350a by using a mask pattern or the second supporting layer 350b as the etch mask. The patterned first supporting layer 350a may expose a part of the first mold layer MD1. Next, the first mold layer MD1 may be removed. An empty space ES may be formed between the lower structure LS and the first supporting layer 350a by removing the first mold layer MD1. A side wall of a lower portion of the lower electrode 320 and an upper surface of the lower structure LS may be exposed in the empty space ES.

Figure 7J:
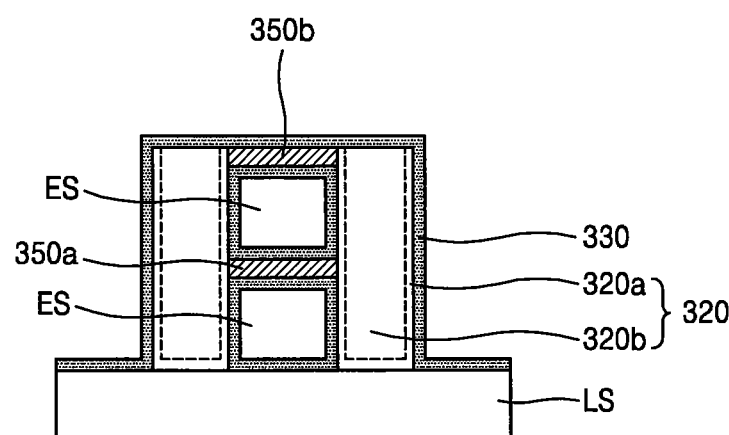

Referring to FIG. 7J, a dielectric layer 330 may be formed on the upper surface and side wall of the lower electrode 320. The dielectric layer 330 may also cover the upper surface of the lower structure LS, upper and lower surfaces of the first supporting layer 350a, and upper and lower surfaces of the second supporting layer 350b. The doped region 320a of the lower electrode 320 may affect the crystal phase of the dielectric layer 330. Therefore, the dielectric layer 330 formed on the doped region 320a of the lower electrode 320 may have a higher dielectric constant than that in the case in which the lower electrode 320 does not include the doped region 320a.

Referring back to FIG. 3, the upper electrode 340 may be formed on the dielectric layer 330. The semiconductor device 300 illustrated in FIG. 3 may be completely formed by the above processes. The capacitor CA3 included in the semiconductor device 300 may include the dielectric layer 330 having a greater dielectric constant and accordingly, may have greater capacitance by including the doped region 320a of the lower electrode 320.

FIGS. 8A to 8J are cross-sectional views illustrating a method of manufacturing a semiconductor device including a capacitor, according to some embodiments of the inventive concept.

Figure 8A:
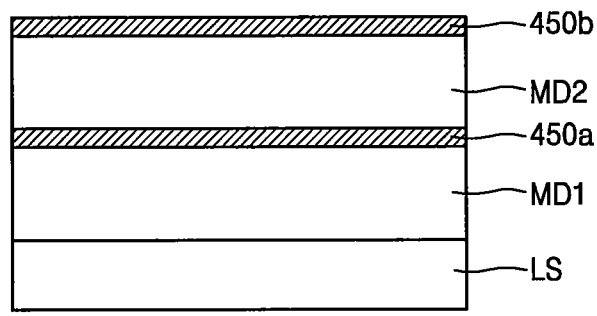
FIGS. 8A to 8J are cross-sectional views illustrating a method of manufacturing a semiconductor device including a capacitor, according to some embodiments of the inventive concept.

Referring to FIG. 8A, a first mold layer MD1, a first supporting layer 450a, a second mold layer MD2, and a second supporting layer 450b are sequentially formed on a lower structure LS.

Figure 8B:
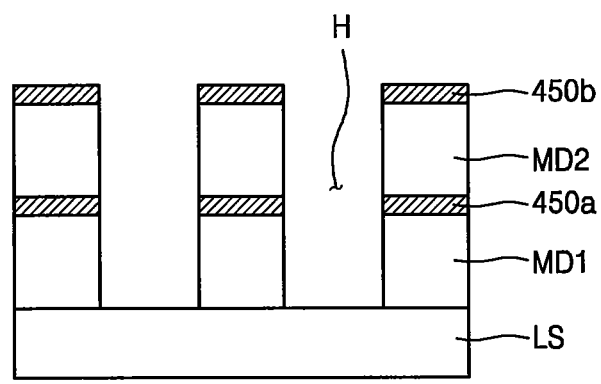

Referring to FIG. 8B, holes H may be formed through the first mold layer MD1, the first supporting layer 450a, the second mold layer MD2, and the second supporting layer 450b and expose the lower structure LS.

Figure 8C:
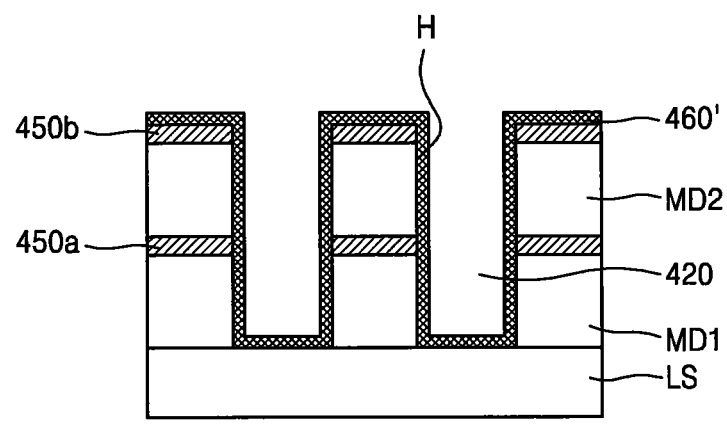

Referring to FIG. 8C, a source layer 460' may be formed in the holes H. The source layer 460' may conformally cover side surfaces and bottoms of the holes H without completely filling the holes H. The source layer 460' may also cover the second supporting layer 450b.

Figure 8D:
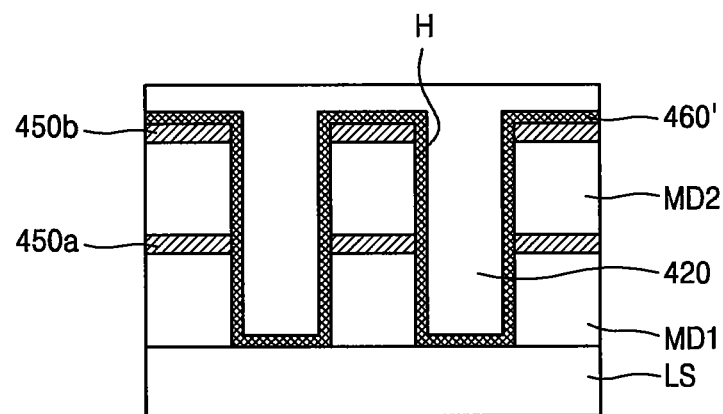

Referring to FIG. 8D, the lower electrode 420 may be formed on the source layer 460'.

Figure 8E:
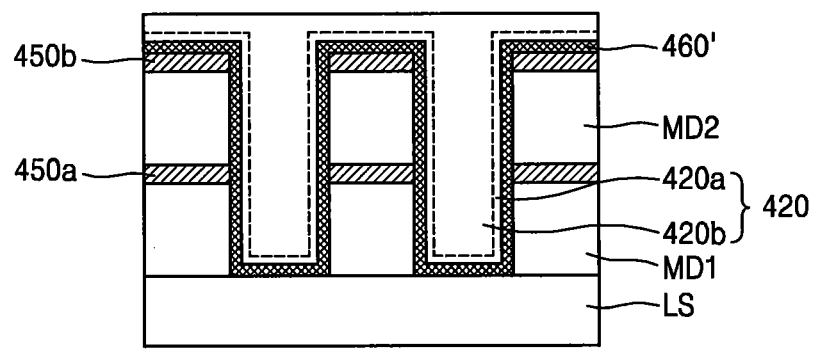

Referring to FIG. 8E, the doped region 420a may be formed on the surface of the lower electrode 420 by moving dopants in the source layer 460' into the lower electrode 420. For example, the dopant in the source layer 460' may be diffused into the lower electrode 420 by increasing temperatures of the source layer 460' and the lower electrode 420.

Figure 8F:
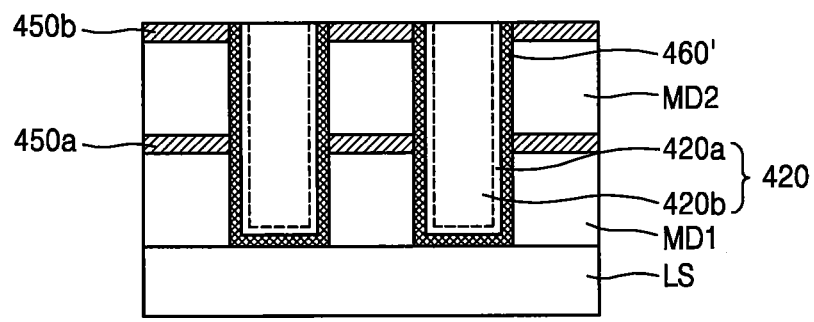

Referring to FIG. 8F, portions of the source layer 460' and the lower electrode 420 that cover the second supporting layer 350b may be removed. For example, etch back or polishing may be used.

Figure 8G:
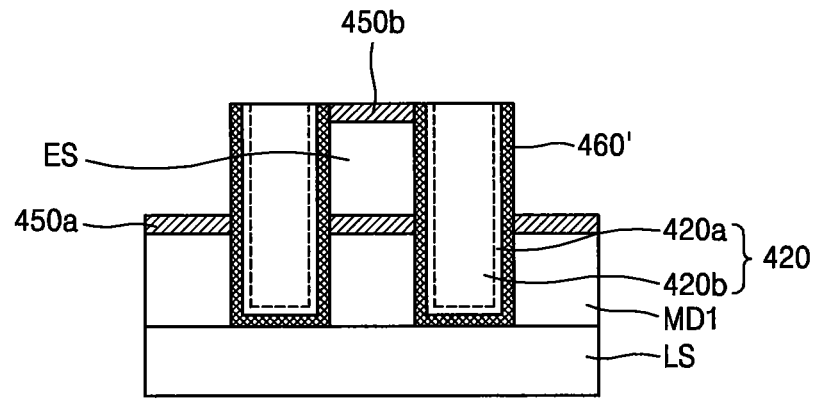

Referring to FIGS. 8F and 8G, the second supporting layer 450b may be patterned. The second supporting layer 450b may be etched by forming a mask pattern on the second supporting layer 450b and using the mask pattern as an etch mask. The patterned second supporting layer 450b may expose a part of the second mold layer MD2. Next, the second mold layer MD2 may be removed. An empty space ES may be formed between the first supporting layer 450a and the second supporting layer 450b by removing the second mold layer MD2. A part of the source layer 460' and an upper surface of the first supporting layer 450a may be exposed in the empty space ES.

Figure 8H:
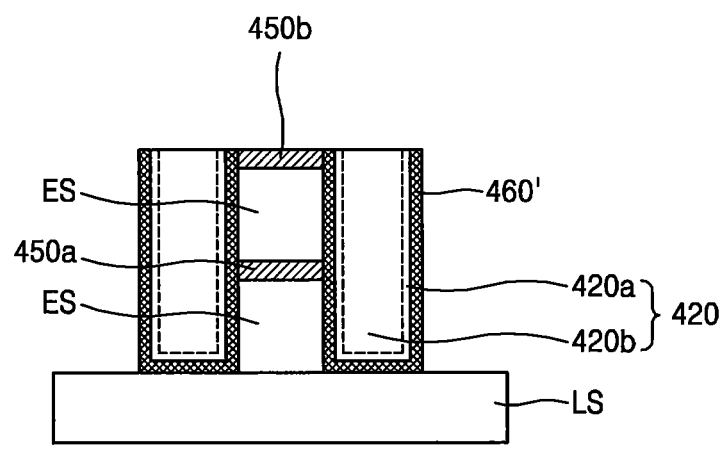

Referring to FIGS. 8G and 8H, the first supporting layer 450a may be patterned by etching the first supporting layer 450a by using a mask pattern or the second supporting layer 450b as the etch mask. The patterned first supporting layer 450a may expose a part of the first mold layer MD1. Next, the first mold layer MD1 may be removed. An empty space ES may be formed between the lower structure LS and the first supporting layer 450a by removing the first mold layer MD1. A part of the source layer 460' and an upper surface of the lower structure LS may be exposed in the empty space ES.

Figure 8I:
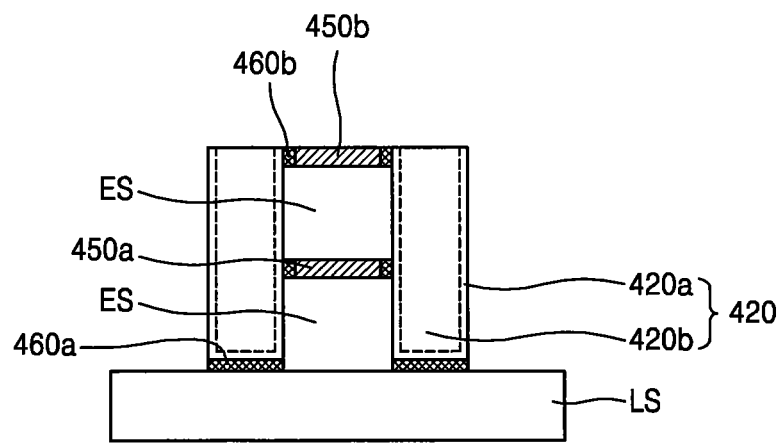

Referring to FIGS. 8H and 8I, at least a part of the source layer 460' may be removed. A remaining part of the source layer 460' may remain as a first residual layer 460a and a second residual layer 460b. In some embodiments, at least a part of the source layer 460' may be removed together with the first mold layer MD1 and the second mold layer MD2 in a process of removing the second mold layer MD2, which is illustrated in FIG. 8G, and a process of removing the first mold layer MD1, which is illustrated in FIG. 8H.

Figure 8J:
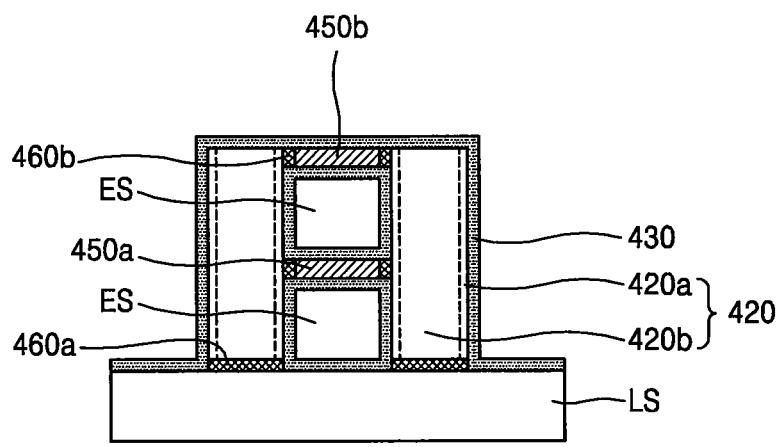

Referring to FIG. 8J, the dielectric layer 430 may be formed on the upper surface and side wall of the lower electrode 420. The dielectric layer 430 may also cover the upper surface of the lower structure LS, upper and lower surfaces of the first supporting layer 450a, and upper and lower surfaces of the second supporting layer 450b. The doped region 420a of the lower electrode 420 may affect the crystal phase of the dielectric layer 430. Therefore, the dielectric layer 430 formed on the doped region 420a of the lower electrode 420 may have a higher dielectric constant than that in the case in which the lower electrode 420 does not include the doped region 420a.

Referring back to FIG. 4, the upper electrode 440 may be formed on the dielectric layer 430. The semiconductor device 400 illustrated in FIG. 4 may be completely formed by the above processes. The capacitor CA4 included in the semiconductor device 400 may include the dielectric layer 430 having a greater dielectric constant and accordingly, may have greater capacitance by including the doped region 420a of the lower electrode 420.

Figure 9:
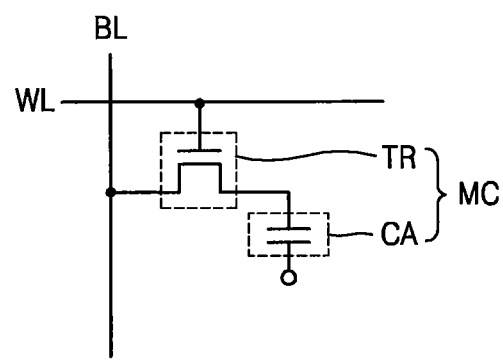
FIG. 9 is a circuit diagram illustrating a semiconductor device including a capacitor, according to some embodiments of the inventive concept.

FIG. 9 is a circuit diagram illustrating a semiconductor device including a capacitor, according to some embodiments of the inventive concept.

Referring to FIG. 9, a memory cell MC may be connected between a word line WL and a bit line BL. The memory cell MC may include a transistor TR and a capacitor CA. The memory cell MC may store data of 0 or 1 in accordance with a presence of charges stored in the capacitor CA. A drain of the transistor TR may be connected to the bit line BL, a source of the transistor TR may be connected to the capacitor CA, and a gate of the transistor TR may be connected to the word line WL. The transistor TR may be configured to control a current that flows from and to the capacitor CA. The capacitor CA may be one of the capacitors CA1 to CA4 illustrated in FIGS. 1 to 4.

Figure 10A:
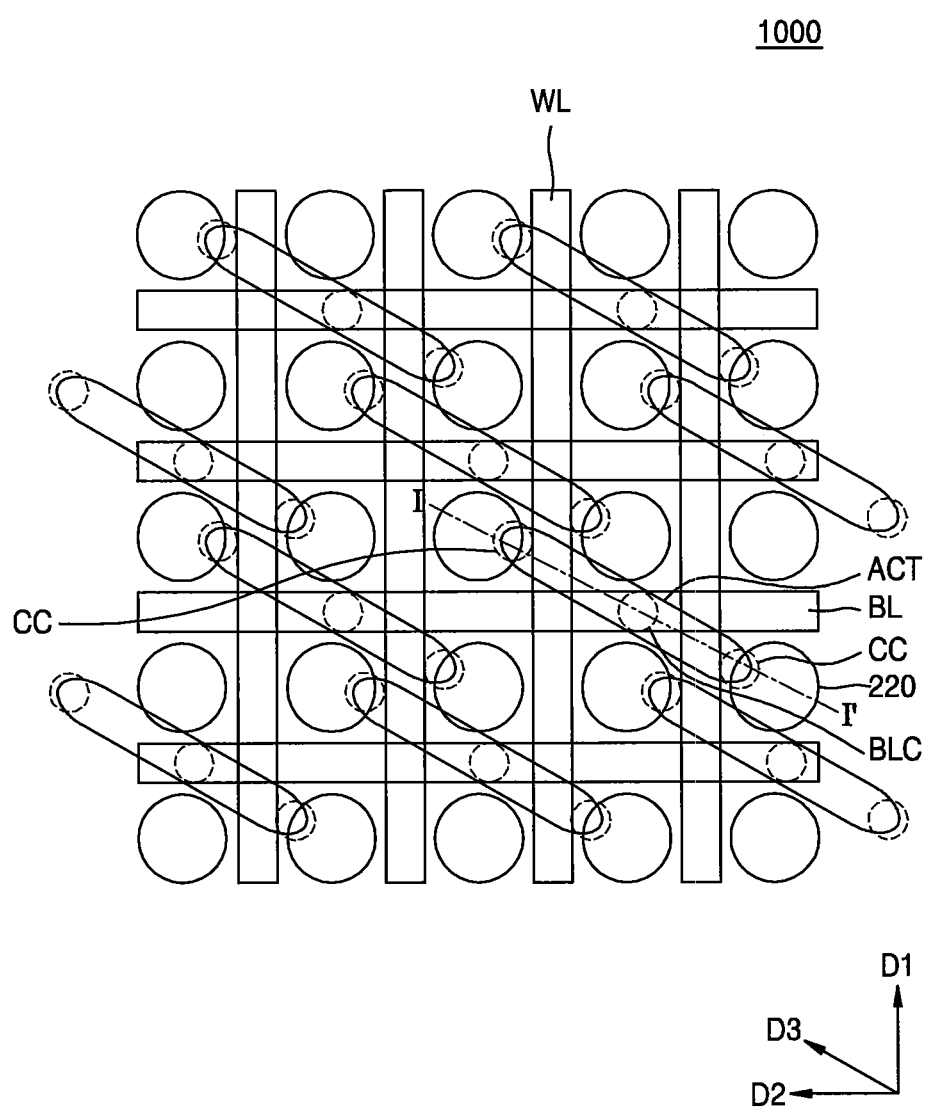
FIG. 10A is a plan view illustrating a semiconductor device including a capacitor, according to some embodiments of the inventive concept.
Figure 10B:
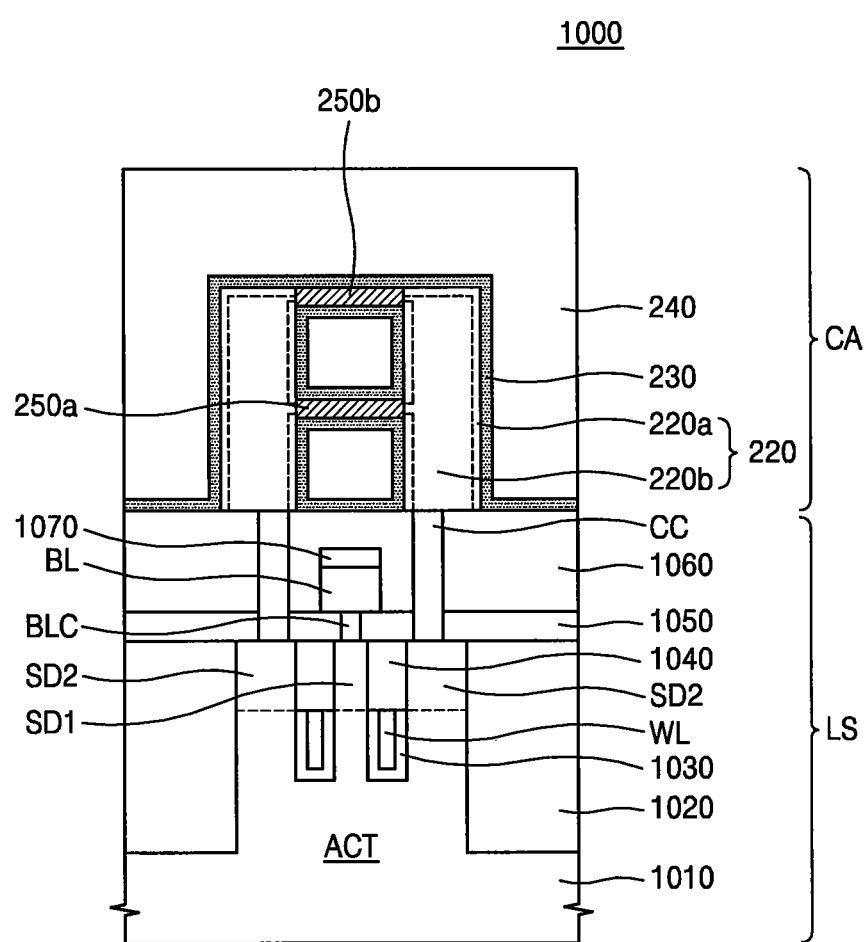
FIG. 10B is a cross-sectional view taken along the line I-I' of FIG. 10A.

FIG. 10A is a plan view illustrating a semiconductor device 1000 including a capacitor, according to some embodiments of the inventive concept. FIG. 10B is a cross-sectional view taken along the line I-I' of FIG. 10A.

Referring to FIGS. 10A and 10B, in some embodiments, the semiconductor device 1000 may be a memory device such as dynamic random access memory (DRAM). However, the inventive concept is not limited thereto. The semiconductor device 1000 may include a lower structure LS and a capacitor CA on the lower structure LS. In FIG. 10B, it is illustrated that the capacitor CA is the same as the capacitor CA2 illustrated in FIG. 2. However, the capacitor CA may be the same as one of the capacitors CA1 to CA4 illustrated in FIGS. 1 to 4. The lower structure LS may include the transistor, the word line WL, and the bit line BL.

An isolation layer 1020 that defines a plurality of active regions ACT may be provided in a substrate 1010. The substrate 1010 may include a semiconductor material such as a Group IV semiconductor material, a Group III-V semiconductor material, or a Group II-VI semiconductor material. The Group IV semiconductor material may include, for example, silicon (Si), germanium (Ge), or Si—Ge. The Group III-V semiconductor material may include, for example, GaAs, InP, GaP, InAs, InSb, or InGaAs. The Group II-VI semiconductor material may include, for example, ZnTe or CdS. The substrate 1010 may include a bulk wafer or an epitaxial layer. The isolation layer 1020 may include, for example, silicon oxide, silicon nitride, silicon oxynitride, or a combination thereof. However, the inventive concept is not limited thereto. On a plane, each of the active regions ACT may have a form of an island having a long axis in a third direction D3.

A plurality of word lines WL may intersect with the active regions ACT. The plurality of word lines WL may extend in a first direction D1. The plurality of word lines WL may be buried in the substrate 1010. Each of the word lines WL may include a conductive material. Each of the word lines WL may include, for example, polysilicon, a metal, a metal nitride, or a combination thereof. However, the inventive concept is not limited thereto. A gate insulating layer 1030 may be between the word line WL and the active region ACT. The gate insulating layer 1030 may include, for example, silicon oxide, silicon nitride, silicon oxynitride, or a combination thereof. However, the inventive concept is not limited thereto. A word line capping layer 1040 may be on the word line WL. An upper surface of the word line capping layer 1040 may be coplanar with an upper surface of the substrate 1010. The word line capping layer 1040 may include, for example, silicon oxide, silicon nitride, silicon oxynitride, or a combination thereof. However, the inventive concept is not limited thereto.

A first source/drain region SD1 may be positioned in the center of each of the active regions ACT and a pair of second source/drain regions SD2 may be positioned at both ends of each of the active regions ACT. The first source/drain region SD1 may be between a pair of word lines WL, and the pair of second source/drain regions SD2 may be apart from each other by the pair of word lines WL.

A first interlayer insulating layer 1050 may be positioned on the substrate 1010. The first interlayer insulating layer 1050 may include, for example, silicon oxide, silicon nitride, silicon oxynitride, or a combination thereof. However, the inventive concept is not limited thereto.

A plurality of bit lines BL may be positioned on the first interlayer insulating layer 1050. Each of the plurality of bit lines BL may extend in a second direction D2. Each of the bit lines BL may include, for example, polysilicon, metal, metal nitride, a metal-semiconductor compound, or a combination thereof. However, the inventive concept is not limited thereto. The bit line BL may be connected to the first source/drain region SD1 through a bit line contact BLC that passes through the first interlayer insulating layer 1050. The bit line contact BLC may include, for example, polysilicon, metal, metal nitride, a metal-semiconductor compound, or a combination thereof. However, the inventive concept is not limited thereto. A bit line capping layer 1070 may be positioned on the bit line BL. The bit line capping layer 1070 may include, for example, silicon oxide, silicon nitride, silicon oxynitride, or a combination thereof. However, the inventive concept is not limited thereto.

A second interlayer insulating layer 1060 may be provided on the first interlayer insulating layer 1050. The second interlayer insulating layer 1060 may cover the bit line BL and the bit line capping layer 1070. The second interlayer insulating layer 1060 may include, for example, silicon oxide, silicon nitride, silicon oxynitride, or a combination thereof. However, the inventive concept is not limited thereto.

The capacitor CA may be positioned on the second interlayer insulating layer 1060. The capacitor CA may be connected to a second source/drain region SD2 through a capacitor contact CC that passes through the second interlayer insulating layer 1060 and the first interlayer insulating layer 1050.

While the inventive concept has been particularly shown and described with reference to example embodiments thereof, it will be understood that various changes in form and details may be made therein without departing from the spirit of the inventive concept and scope of the following claims.

What is claimed is:

1. A semiconductor device comprising:
   a substrate;
   a lower electrode in a hole that extends in a vertical direction on the substrate;
   a supporting layer that is on a side wall of the lower electrode and is configured to support the lower electrode;
   a dielectric layer on the lower electrode and the supporting layer; and
   an upper electrode on the dielectric layer,
   wherein the lower electrode comprises an undoped region and a doped region,
   wherein the doped region contacts the dielectric layer and the supporting layer, wherein the undoped region is separated from the supporting layer by the doped region,
wherein the lower electrode comprises silicon or metal nitride, and
wherein the dielectric layer comprises hafnium oxide, zirconium oxide, aluminum oxide, or titanium oxide.

2. The semiconductor device of claim 1, wherein the lower electrode has a pillar shape.

3. The semiconductor device of claim 1, wherein the doped region of the lower electrode comprises niobium (Nb).

4. The semiconductor device of claim 1, wherein the supporting layer extends around an upper portion of the side wall of the lower electrode and is configured to support an upper portion of the lower electrode, and
the supporting layer does not contact the undoped region of the lower electrode.

5. The semiconductor device of claim 4, wherein an upper surface of the supporting layer is at a same vertical level as an upper surface of the lower electrode.

6. The semiconductor device of claim 1, wherein the doped region of the lower electrode is configured to increase a dielectric constant of the dielectric layer.

7. A semiconductor device comprising:
a substrate;
a lower electrode in a hole that extends in a vertical direction on the substrate;
a plurality of supporting layers that are on a side wall of the lower electrode and are configured to support the lower electrode;
a dielectric layer on an upper surface of the lower electrode, the side wall of the lower electrode, and each of the plurality of supporting layers; and
an upper electrode on the dielectric layer,
wherein the lower electrode comprises an undoped region and a doped region,
wherein the doped region of the lower electrode is between the undoped region of the lower electrode and the upper surface of the lower electrode and is between the undoped region and the side wall of the lower electrode,
wherein at least one of the plurality of supporting layers contacts the doped region of the lower electrode and does not contact the undoped region of the lower electrode,
wherein the lower electrode comprises silicon or metal nitride, and
wherein the dielectric layer comprises hafnium oxide, zirconium oxide, aluminum oxide, or titanium oxide.

8. The semiconductor device of claim 7, wherein the undoped region is separated from the at least one of the plurality of supporting layers by the doped region.

9. The semiconductor device of claim 7, wherein the plurality of supporting layers comprise a first supporting layer that extends around an upper portion of the side wall of the lower electrode and is configured to support an upper portion of the lower electrode, and
the first supporting layer contacts the doped region of the lower electrode and does not contact the undoped region of the lower electrode.

10. The semiconductor device of claim 9, wherein an upper surface of the first supporting layer is at a same vertical level as the upper surface of the lower electrode.

11. The semiconductor device of claim 7, wherein the plurality of supporting layers comprise a second supporting layer that extends around a lower portion of the side wall of the lower electrode and is configured to support a lower portion of the lower electrode, and
the second supporting layer contacts the doped region of the lower electrode and does not contact the undoped region of the lower electrode.

12. The semiconductor device of claim 11, wherein an upper surface of the second supporting layer is closer than the upper surface of the lower electrode to the substrate.

13. The semiconductor device of claim 7, wherein the lower electrode has a pillar shape.

14. The semiconductor device of claim 7, wherein the doped region of the lower electrode comprises niobium (Nb).

15. A semiconductor device comprising:
a substrate;
an active region defined by an isolation film in the substrate;
a word line that is in the substrate and extends in a first horizontal direction across the active region;
a bit line on the word line, the bit line extending in a second horizontal direction that is perpendicular to the first horizontal direction; and
a capacitor on the bit line,
wherein the capacitor includes:
a lower electrode on the substrate, wherein the lower electrode has a pillar shape filling a hole that extends in a vertical direction;
a supporting layer that is on a side wall of the lower electrode and is configured to support the lower electrode;
a dielectric layer on the lower electrode and the supporting layer; and
an upper electrode on the dielectric layer,
wherein the lower electrode comprises an undoped region and a doped region,
wherein the doped region contacts the dielectric layer and the supporting layer,
wherein the undoped region is separated from the supporting layer by the doped region,
wherein the lower electrode comprises silicon or metal nitride, and
wherein the dielectric layer comprises hafnium oxide, zirconium oxide, aluminum oxide, or titanium oxide.

16. The semiconductor device of claim 15, wherein the supporting layer extends in the first and second horizontal directions.

17. The semiconductor device of claim 15, wherein the supporting layer is on an upper portion of the side wall of the lower electrode and is configured to support an upper portion of the lower electrode, and
the supporting layer does not contact the undoped region of the lower electrode.

18. The semiconductor device of claim 17, wherein an upper surface of the supporting layer is at a same vertical level as an upper surface of the lower electrode.

19. The semiconductor device of claim 15, wherein the doped region of the lower electrode comprises niobium (Nb).

20. The semiconductor device of claim 15, wherein the doped region of the lower electrode is configured to increase a capacitance of the capacitor.

* * * * *